(12) United States Patent
Yoo et al.

(10) Patent No.: US 12,176,871 B2
(45) Date of Patent: Dec. 24, 2024

(54) DIFFERENTIAL AMPLIFIER CAPABLE OF OFFSET COMPENSATION OF DIFFERENTIAL OUTPUT SIGNAL AND ADAPTIVE CONTINUOUS-TIME LINEAR EQUALIZER INCLUDING THE SAME

(71) Applicant: SAMSUNG ELECTRONICS CO., LTD., Suwon-si (KR)

(72) Inventors: Soohwan Yoo, Seoul (KR); Yohan Kim, Seoul (KR); Hyeonwoo Ahn, Seoul (KR); Jaegeol Lee, Seoul (KR); Yongsam Moon, Seoul (KR); Jihwan Hyun, Suwon-si (KR); Junghwan Choi, Suwon-si (KR)

(73) Assignees: Samsung Electronics Co., Ltd. (KR); University of Seoul Industry Cooperation Foundation (KR)

( * ) Notice: Subject to any disclaimer, the term of this patent is extended or adjusted under 35 U.S.C. 154(b) by 63 days.

(21) Appl. No.: 17/994,171

(22) Filed: Nov. 25, 2022

(65) Prior Publication Data
US 2023/0318551 A1 Oct. 5, 2023

(30) Foreign Application Priority Data
Mar. 29, 2022 (KR) .................. 10-2022-0039174

(51) Int. Cl.
*H03F 3/45* (2006.01)
(52) U.S. Cl.
CPC ... *H03F 3/45197* (2013.01); *H03F 2200/375* (2013.01); *H03F 2203/45214* (2013.01); *H03F 2203/45588* (2013.01)

(58) Field of Classification Search
CPC .......... H03F 3/45197; H03F 2200/375; H03F 2203/45214; H03F 2203/45588;
(Continued)

(56) References Cited

U.S. PATENT DOCUMENTS

| 7,697,601 B2 | 4/2010 | Mansuri et al. |
| 7,940,840 B2 | 5/2011 | Tian et al. |
(Continued)

FOREIGN PATENT DOCUMENTS

WO WO-2016203972 A1 * 12/2016 ............... H04B 1/16

OTHER PUBLICATIONS

Jong-Sang Choi et al,, A 0.18-UM CMOS 3.5-GB/S Continuous-Time Adaptive Cable Equalizer Using Enhanced Low-Frequency Gain Control Method, Mar. 2004, pp. 419-425, IEEE Journal of Solid-State Circuits, vol. 39, No. 3, Seoul, Korea.

*Primary Examiner* — Andrea Lindgren Baltzell
*Assistant Examiner* — Khiem D Nguyen
(74) *Attorney, Agent, or Firm* — Fish & Richardson P.C.

(57) ABSTRACT

An adaptive continuous-time linear equalizer (CTLE) includes a CTLE cell including input terminals and output terminals, a low-pass filter configured to respectively output low-band differential signals obtained by respectively low-pass filtering differential output signals, and an error amplifier configured to amplify a difference between the low-band differential signals and output the difference as a control voltage. The CTLE cell includes first and second transistors each including an input terminal and an output terminal and an offset compensator configured to adjust a potential difference between a supply voltage source and the output terminal according to the control voltage.

19 Claims, 8 Drawing Sheets

(58) Field of Classification Search
CPC ......... H03F 2200/171; H03F 2200/498; H03F 2203/45202; H03F 2203/45258; H03F 2203/45491; H03F 2203/45594; H03F 2203/45624; H03F 2203/45681; H03F 2203/45718; H03F 2203/45728; H03F 3/45605; H03F 3/193; H03F 3/45744; H03F 3/45183; H04L 25/03878
USPC ....................................................... 330/253
See application file for complete search history.

(56) References Cited

U.S. PATENT DOCUMENTS

| | | |
|---|---|---|
| 8,872,541 B2 | 10/2014 | Mandal |
| 9,520,872 B2 | 12/2016 | Pandita |
| 9,621,176 B2 | 4/2017 | Mishra et al. |
| 10,790,864 B1 | 9/2020 | Lee |
| 11,075,610 B2 | 7/2021 | Hong et al. |
| 2014/0177696 A1* | 6/2014 | Hwang ............... H04L 25/0272 375/232 |

* cited by examiner

DIFFERENTIAL AMPLIFIER CAPABLE OF OFFSET COMPENSATION OF DIFFERENTIAL OUTPUT SIGNAL AND ADAPTIVE CONTINUOUS-TIME LINEAR EQUALIZER INCLUDING THE SAME

CROSS-REFERENCE TO RELATED APPLICATION

This application is based on and claims priority under 35 U.S.C. § 119 to Korean Patent Application No. 10-2022-0039174, filed on Mar. 29, 2022, in the Korean Intellectual Property Office, the disclosure of which is incorporated by reference herein in its entirety.

BACKGROUND

The disclosure relates to a differential amplifier and an adaptive continuous-time linear equalizer (CTLE) including the same and, more particularly, to a differential amplifier capable of adaptive offset compensation of a differential output signal and an adaptive CTLE including the same.

When a digital signal has a high transmission speed, distortion occurs in a waveform of the received digital signal.

FIG. 1 is a schematic diagram illustrating distortion of a waveform. Referring to FIG. 1, when a pulse having a length of $T_b$ is transmitted through a lossy channel (e.g., a signal transmission cable, etc.), a distorted signal $x_n$ is received at a receiving end. For example, the received signal $x_n$ gradually rises from $t=-T_b$ and reaches $C_0$ (Main Cursor) at $t=0$ due to the low-pass filter characteristic of the lossy channel. The signal $x_n$ slowly descends from $t=0$, reaches $C_1$ (Post Cursor) at $t=T_b$, and reaches $C_2$ (Post Cursor) at $t=2T_b$. That is, the signal $x_n$ does not reach 0 even at $t=2T_b$.

To compensate for the distortion of the waveform, a continuous-time linear equalizer (CTLE) is used.

FIG. 2 is a block diagram illustrating a CTLE 1000 according to the related art.

Referring to FIG. 2, the CTLE 1000 according to the related art includes a CTLE cell 10, a comparator 20, high pass filters (HPFs) 30a and 30b, and a rectified error amplifier 40.

The CTLE cell 10 equalizes differential input signals $RX_1$ and $RX_2$ to output differential output signals $EQ_1$ and $EQ_2$, respectively.

Specifically, the CTLE cell 10 includes input terminals $IN_1$ and $IN_2$ to which the differential input signals $RX_1$ and $RX_2$ are respectively applied and output terminals $OUT_1$ and $OUT_2$ outputting the differential output signals $EQ_1$ and $EQ_2$, respectively.

Hereinafter, the CTLE cell 10 according to the related art will be described in detail with reference to FIG. 3.

FIG. 3 is a diagram illustrating the CTLE cell 10 according to the related art. The CTLE cell 10 includes a differential amplifier shown in FIG. 3.

Referring to FIG. 3, the differential amplifier constituting the CTLE cell 10 includes a first transistor $TR_1$, a second transistor $TR_2$, a resistor $R_{D1}$, a resistor $R_{D2}$, a resistor $R_s$, and a capacitor Cs.

The CTLE cell 10 shown in FIG. 3 performs equalization by adjusting a resistance value of the resistor $R_s$ and a capacitance of the capacitor Cs.

Specifically, the resistor $R_s$ adjusts a low frequency amplification gain of the CTLE cell 10 and the capacitor Cs adjusts a high frequency amplification gain of the CTLE cell 10.

The resistor $R_s$ is a variable resistor having an adjustable resistance value.

In addition, the capacitance of the capacitor Cs is adjusted by a control voltage $Z_{CTRL}$.

Hereinafter, a method of adjusting the capacitance of the capacitor Cs will be described in detail.

The CTLE cell 10 equalizes the differential input signals $RX_1$ and $RX_2$ to output the differential output signals $EQ_1$ and $EQ_2$, respectively.

The differential output signals $EQ_1$ and $EQ_2$ are filtered by the HPF 30a and output as high-band differential output signals $EQ_{1H}$ and $EQ_{2H}$.

The differential output signals $EQ_1$ and $EQ_2$ are input to the comparator 20 and output as differential output signals $COMP_1$ and $COMP_2$, respectively.

The differential output signals $COMP_1$ and $COMP_2$ are both filtered by the HPF 30b and output as high-band differential output signals $COMP_{1H}$ and $COMP_{2H}$.

The rectified error amplifier 40 amplifies a difference between a signal having a larger magnitude among the high-band differential output signals $EQ_{1H}$ and $EQ_{2H}$ and a signal having a larger magnitude among the high-band differential output signals $COMP_{1H}$ and $COMP_{2H}$ to output the amplified difference as the control voltage $Z_{CTRL}$.

The control voltage $Z_{CTRL}$ is expressed as in Equation 1 below.

$$Z_{CTRL}=A_1\times[\max(EQ_1H,EQ_2H)-\max(COMP_{1H},COMP_{2H})]+Z_{CTRL.DC} \quad \text{[Equation 1]}$$

Here, $A_1$ denotes a gain and $Z_{CTRL.DC}$ denotes a DC bias value of $Z_{CTRL}$. In general, the DC bias value corresponds to an intermediate value among the range of values of a circuit.

For example, when $EQ_{1H} > EQ_{2H}$ and $COMP_{1H} < COMP_{2H}$, the rectified error amplifier 40 outputs the control voltage $Z_{CTRL}$ of Equation 2 below.

$$Z_{CTRL}=A_1\times(EQ_{1H}-COMP_{2H})+Z_{CTRL.DC} \quad \text{[Equation 2]}$$

The control voltage $Z_{CTRL}$ is provided as feedback to the CTLE cell 10 and used to adjust the capacitance of the capacitor Cs. That is, the high frequency amplification gain of the CTLE cell 10 is adjusted by adjusting the capacitance of the capacitor Cs according to the control voltage $Z_{CTRL}$. This process is repeated until $\max(EQ_{1H}, EQ_{2H}) \approx \max(COMP_{1H}, COMP_{2H})$. At this time, because $A_1$ is large, generally $Z_{CTRL} \neq Z_{CTRL.DC}$.

The CTLE cell 10 according to the related art performs equalization by adaptively adjusting the high-frequency amplification gain and the low-frequency amplification gain.

However, the CTLE cell 10 according to the related art has a problem in that an offset that may occur during an equalization process is not adaptively removed.

Hereinafter, this will be described in detail with reference to FIGS. 4A to 5B.

FIGS. 4A and 4B are waveform diagrams illustrating the differential output signals $EQ_1$ and $EQ_2$ of the ideal CTLE cell 10 and a difference therebetween.

As shown in FIG. 4A, the ideal CTLE cell 10 outputs the differential output signals $EQ_1$ and $EQ_2$ symmetric with respect to a common mode voltage $EQ_{CM}$. When the differential output signals $EQ_1$ and $EQ_2$ are symmetric with respect to the common mode voltage $EQ_{CM}$, the difference $EQ_1-EQ_2$ between the differential output signals $EQ_1$ and $EQ_2$ swings with respect to zero, as shown in FIG. 4B.

The CTLE cell 10 includes a number of elements, as illustrated in FIG. 3. However, because the elements constituting the CTLE cell 10 are not all ideal elements, there is an offset in the differential output signals $EQ_1$ and $EQ_2$ of the CTLE cell 10, as shown in FIG. 5A. Also, an offset may be generated due to a non-ideal transmission channel, etc.

FIG. 5A is a waveform diagram illustrating the differential output signals $EQ_1$ and $EQ_2$ of the CTLE cell 10 in which an offset is generated and illustrates a case in which there is an offset in the differential output signal $EQ_1$.

As shown in FIG. 5A, the offset indicated by an arrow is in the differential output signal $EQ_1$. Accordingly, voltages of the differential output signals $EQ_1$ and $EQ_2$ are not symmetric with respect to the common mode voltage $EQ_{CM}$.

When there is an offset in the differential output signal $EQ_1$, the differences $EQ_1$-$EQ_2$ of the differential output signals $EQ_1$ and $EQ_2$ are shown in FIG. 5B.

Referring to FIG. 5B, due to the offset in the differential output signal $EQ_1$, the offset indicated by the arrow is also in the difference $EQ_1$-$EQ_2$ of the differential output signals $EQ_1$ and $EQ_2$. Accordingly, the differences $EQ_1$-$EQ_2$ of the differential output signals $EQ_1$ and $EQ_2$ does not swing with respect to zero.

The offset may be in only one of the differential output signals $EQ_1$ and $EQ_2$ or in both.

The size of the offset varies depending on the characteristics of a transmission channel or a mismatch of the elements constituting the CTLE cell 10.

When there is an offset, a problem may arise in determining a level of a received signal.

For example, it is supposed that the level of the received signal is determined to be 1 when $EQ_1$-$EQ_2>0$, and the level of the received signal is determined to be 0 when $EQ_1$-$EQ_2<0$. Because the difference $EQ_1$-$EQ_2$ in FIG. 5B is biased upward from 0, the probability of determining the level of the received signal as 1 is higher. That is, in some cases, there is a problem that the level of the received signal may not be accurately determined.

In order to accurately determine the level of the received signal, the difference $EQ_1$-$EQ_2$ needs to swing with reference to zero. Therefore, there is a need for compensating for or removing the above-mentioned offset.

SUMMARY

The disclosure provides a differential amplifier capable of offset compensation of a differential output signal and an adaptive continuous-time linear equalizer (CTLE) including the same.

According to an aspect of the disclosure, there is provided a continuous-time linear equalizer (CTLE) cell constituting a CTLE that equalizes differential input signals $RX_1$ and $RX_2$ and respectively generates differential output signals $EQ_1$ and $EQ_2$ including a first transistor including an input terminal $IN_1$ to which the differential input signal $RX_1$ is applied and an output terminal $OUT_1$ configured to output the differential output signal $EQ_1$, a second transistor including an input terminal $IN_2$ to which the differential input signal $RX_2$ is applied and an output terminal $OUT_2$ configured to output the differential output signal $EQ_2$, and an offset compensator configured to adjust a potential difference between a supply voltage source and the output terminal $OUT_2$ according to a control voltage $R_{CTRL}$ corresponding to a difference between low-band differential signals $EQ_{1L}$ and $EQ_{2L}$ obtained by respectively low-pass filtering the differential output signals $EQ_1$ and $EQ_2$.

According to another aspect of the disclosure, there is provided a CTLE that equalizes differential input signals $RX_1$ and $RX_2$ and respectively generates differential output signals $EQ_1$ and $EQ_2$ including a CTLE cell including input terminals $IN_1$ and $IN_2$ to which the differential input signals $RX_1$ and $RX_2$ are respectively applied and output terminals $OUT_1$ and $OUT_2$ configured to respectively output the differential output signals $EQ_1$ and $EQ_2$, a low-pass filter configured to respectively output low-band differential signals $EQ_{1L}$ and $EQ_{2L}$ obtained by respectively low-pass filtering the differential output signals $EQ_1$ and $EQ_2$, and an error amplifier configured to amplify a difference between the low-band differential signals $EQ_{1L}$ and $EQ_{2L}$ and output the amplified difference as a control voltage $R_{CTRL}$, wherein the CTLE cell includes a first transistor including the input terminal $IN_1$ and the output terminal $OUT_1$, a second transistor including the input terminal $IN_2$ and the output terminal $OUT_2$, and an offset compensator configured to adjust a potential difference between a supply voltage source and the output terminal $OUT_2$ according to the control voltage $R_{CTRL}$.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Hereinafter, a differential amplifier capable of offset compensation of a differential output signal and an adaptive continuous-time linear equalizer (CTLE) including the same according to the disclosure will be described in detail with reference to the accompanying drawings.

Figure 6:
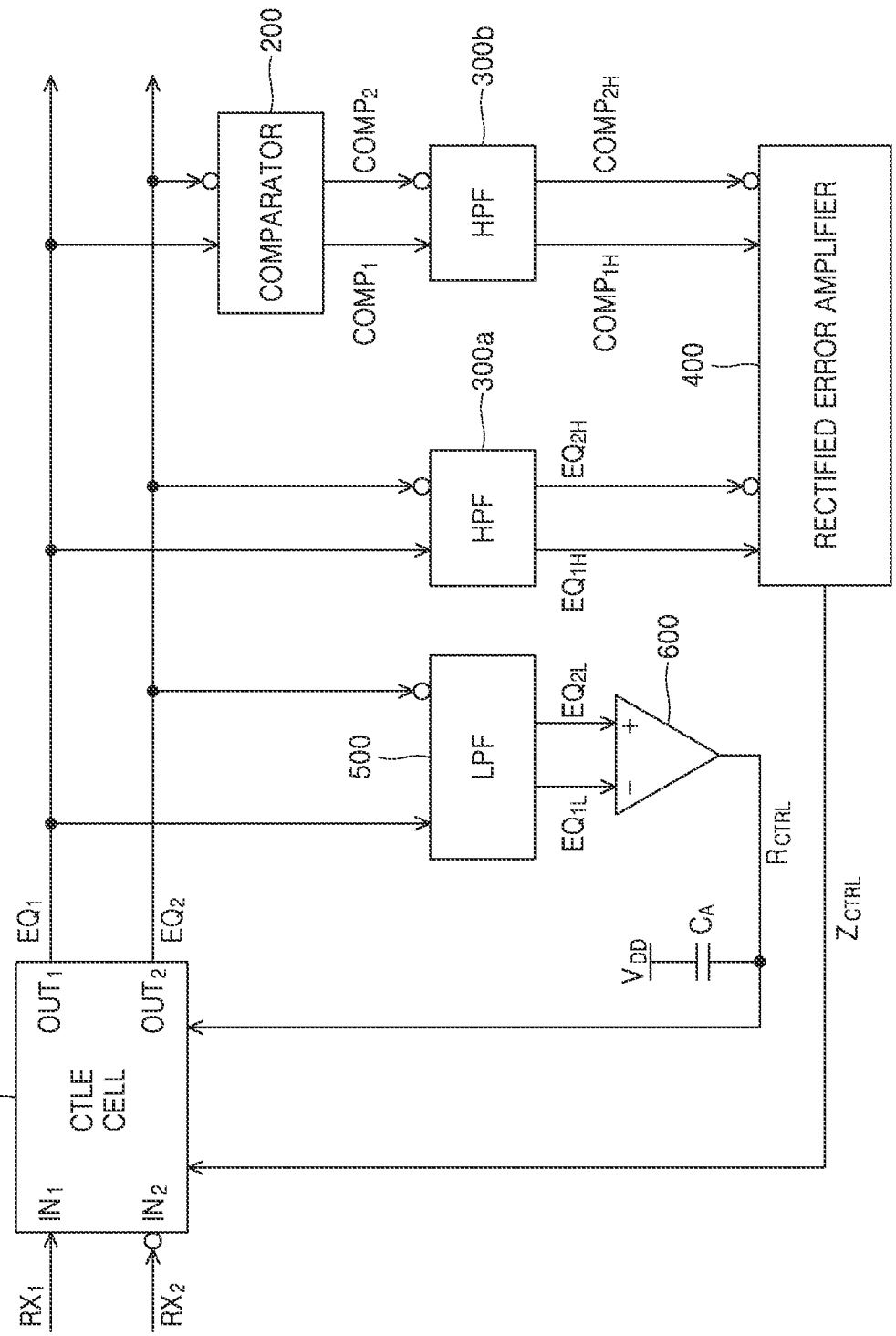
FIG. 6 is a block diagram illustrating a CTLE according to the disclosure.

FIG. 6 is a block diagram illustrating a CTLE 2000 according to the disclosure.

Referring to FIG. 6, the CTLE 2000 according to the disclosure includes a CTLE cell 100, a low pass filter (LPF) 500, and an error amplifier 600. In addition, the CTLE 2000 according to the disclosure may further include a comparator 200, high pass filters 300a and 300b, a rectified error amplifier 400, and a capacitor $C_A$.

The CTLE cell 100 equalizes the differential input signals $RX_1$ and $RX_2$ to output the differential output signals $EQ_1$ and $EQ_2$, respectively.

Specifically, the CTLE cell 100 includes the input terminals $IN_1$ and $IN_2$ to which the differential input signals $RX_1$ and $RX_2$ are respectively applied and the output terminals OUT$_1$ and OUT$_2$ outputting the differential output signals EQ$_1$ and EQ$_2$, respectively.

Hereinafter, the CTLE cell 100 according to the disclosure will be described in detail with reference to FIG. 7.

Figure 7:
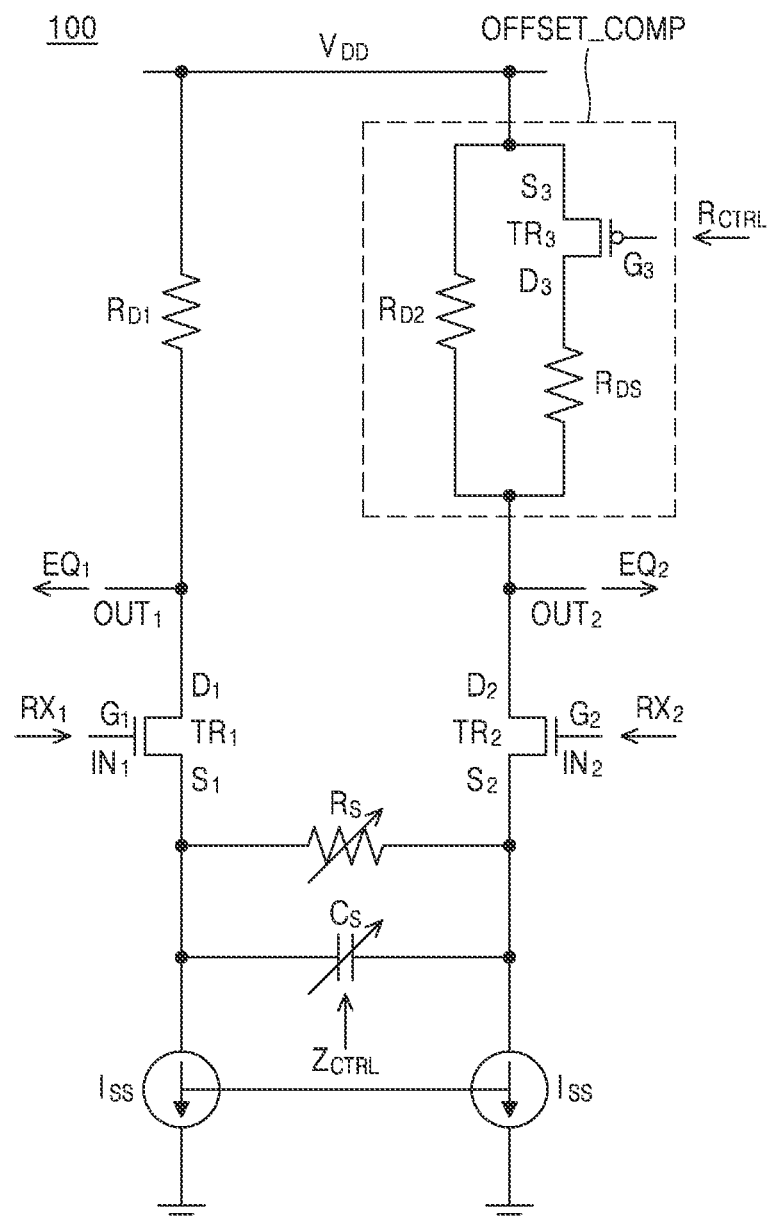
FIG. 7 is a circuit diagram illustrating a differential amplifier of a CTLE cell constituting the CTLE of FIG. 6 according to the disclosure.

FIG. 7 is a diagram illustrating the CTLE cell 100 according to the disclosure. The CTLE cell 100 includes the differential amplifier shown in FIG. 6.

Referring to FIG. 7, the differential amplifier constituting the CTLE cell 100 includes the first transistor TR$_1$, the second transistor TR$_2$, and an offset compensator OFFSET_COMP. In addition, the differential amplifier constituting the CTLE cell 100 includes the resistor R$_{D1}$, the resistor R$_{D2}$, the resistor R$_s$, and the capacitor Cs.

As shown in FIG. 7, the resistor R$_{D1}$ and the first transistor TR$_1$ are connected in series between a supply voltage source VDD and a current source I$_{SS}$. That is, the resistor R$_{D1}$ electrically connects the supply voltage source VDD to a drain D$_1$ of the first transistor TR$_1$.

Also, the offset compensator OFFSET_COMP and the second transistor TR$_2$ are connected in series between the supply voltage source VDD and the current source I$_{SS}$. That is, the offset compensator OFFSET_COMP electrically connects the supply voltage source VDD to a drain D$_2$ of the second transistor TR$_2$.

In addition, the resistor R$_s$ and the capacitor Cs are connected in parallel between a source S$_1$ of the first transistor TR$_1$ and a source S$_2$ of the second transistor TR$_2$.

Hereinafter, each element of the differential amplifier shown in FIG. 7 will be described in more detail.

The first transistor TR$_1$ includes a gate G$_1$ corresponding to the input terminal IN$_1$ to which the differential input signal RX$_1$ is applied, the drain D$_1$ corresponding to the output terminal OUT$_1$ outputting the differential output signal EQ$_1$, and the source S$_1$ electrically connected to the resistor R$_s$ and the capacitor Cs connected in parallel. The drain D$_1$ is electrically connected to the supply voltage source VDD through the resistor R$_{D1}$.

The second transistor TR$_2$ includes a gate G$_2$ corresponding to the input terminal IN$_2$ to which the differential input signal RX$_2$ is applied, the drain D$_2$ corresponding to the output terminal OUT$_2$ outputting the differential output signal EQ$_2$, and the source S$_2$ electrically connected to the resistor R$_s$ and the capacitor Cs connected in parallel. The drain D$_2$ is electrically connected to the supply voltage source VDD through the offset compensator OFFSET_COMP.

The offset compensator OFFSET_COMP adjusts a potential difference between the supply voltage source VDD and the output terminal OUT$_2$ according to a control voltage R$_{CTRL}$ corresponding to a difference between low-band differential signals EQ$_{1L}$ and EQ$_{2L}$. Here, the control voltage R$_{CTRL}$ amplifies the difference between the low-band differential signals EQ$_{1L}$ and EQ$_{2L}$ obtained by low-pass filtering the differential output signals EQ$_1$ and EQ$_2$.

The control voltage R$_{CTRL}$ is expressed by Equation 3 below.

$$R_{CTRL} = A_2 \times (EQ_{2L} - EQ_{1L}) + R_{CTRL.DC} \quad \text{[Equation 3]}$$

Here, A$_2$ denotes a gain and R$_{CTRL.DC}$ is a DC bias value of R$_{CTRL}$.

Specifically, the offset compensator OFFSET_COMP includes a third transistor TR$_3$, a resistor R$_{DS}$, and a resistor R$_{D2}$.

The third transistor TR$_3$ includes a gate G$_3$ to which the control voltage R$_{CTRL}$ is applied, a source S$_3$ electrically connected to the supply voltage source VDD, and a drain D$_3$ electrically connected to the resistor R$_{DS}$. Here, the third transistor TR$_3$ may include a P-MOSFET.

The resistor R$_{DS}$ electrically connects the drain D$_3$ of the third transistor TR$_3$ to the output terminal OUT$_2$.

The resistor R$_{D2}$ electrically connects the source S$_3$ of the third transistor TR$_3$ to the output terminal OUT$_2$.

The resistor R$_s$ is electrically connected to the source S$_1$ of the first transistor TR$_1$ and the source S$_2$ of the second transistor TR$_2$ and controls the low frequency amplification gain of the CTLE cell 100.

The capacitor Cs is connected in parallel to the resistor R$_s$ to adjust the high frequency amplification gain of the CTLE cell 100.

Referring back to FIG. 6, the LPF 500 of the CTLE 2000 according to the disclosure low-pass filters the differential output signals EQ$_1$ and EQ$_2$ output by the CTLE cell 100, respectively, and outputs the low-band differential signals EQ$_{1L}$ and EQ$_{2L}$, respectively.

The error amplifier 600 amplifies a difference between the low-pass differential signals EQ$_{1L}$ and EQ$_{2L}$ output by the LPF 500 and outputs the difference as the control voltage R$_{CTRL}$.

The error amplifier 600 amplifies a difference between the low-band differential signals EQ$_{1L}$ and EQ$_{2L}$ output by the LPF 500 and outputs the amplified difference as the control voltage R$_{CTRL}$. The control voltage R$_{CTRL}$ output by the error amplifier 600 is applied (as affected by capacitor C$_A$) to the gate G$_3$ of the third transistor TR$_3$ included in the CTLE cell 100.

The capacitor C$_A$ generates an average value of the control voltage R$_{CTRL}$ provided as feedback to the CTLE cell 100. The capacitor C$_A$ is connected between the supply voltage source VDD and an output terminal of the error amplifier 600. The resistance value of the offset compensator OFFSET_COMP may be adjusted using the control voltage R$_{CTRL}$ obtained with respect to each pulse of the low-band differential signals EQ$_{1L}$ and EQ$_{2L}$ but may be adjusted according to the average of the control voltage R$_{CTRL}$. In this case, the resistance value of the offset compensator OFFSET_COMP is adjusted to be relatively smoother.

Figure 1:
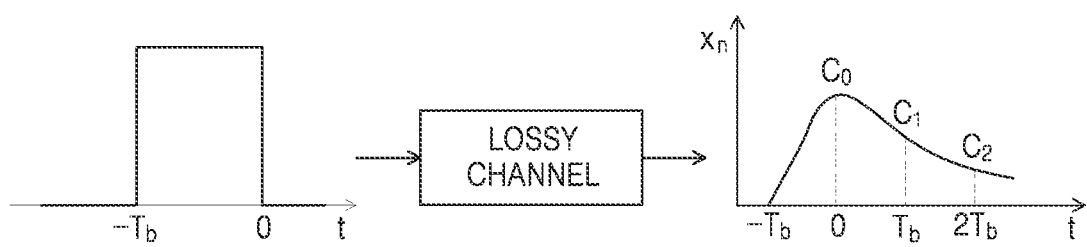
FIG. 1 is a schematic diagram illustrating distortion of a waveform according to the related art.
Figure 2:
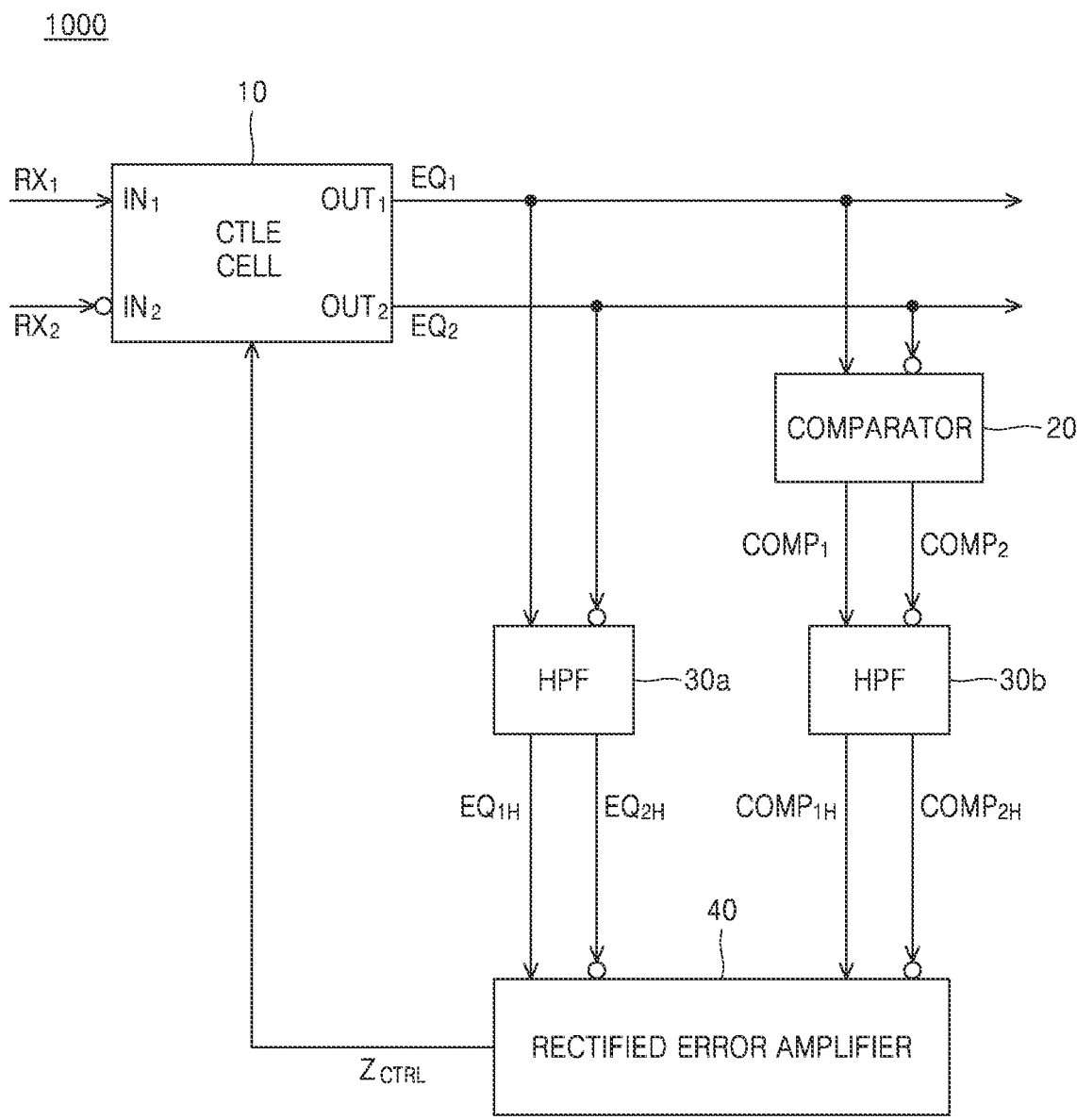
FIG. 2 is a block diagram illustrating a continuous-time linear equalizer (CTLE) according to the related art.

The comparator 200, the high-pass filters 300*a* and 300*b*, and the rectified error amplifier 400 are the same as the comparator 20, the high-pass filters 30*a* and 30*b*, and the rectified error amplifier 40 of the CTLE of the related art described with reference to FIG. 2, and thus, detailed descriptions thereof will be omitted.

Figure 3:
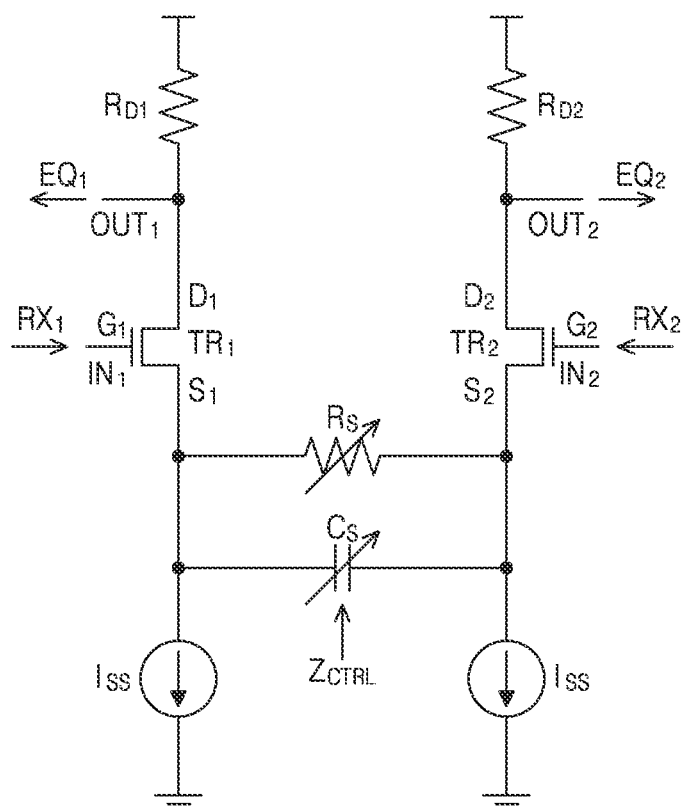
FIG. 3 is a circuit diagram illustrating a differential amplifier of a CTLE cell constituting the CTLE of FIG. 2 according to the related art.
Figure 4A:
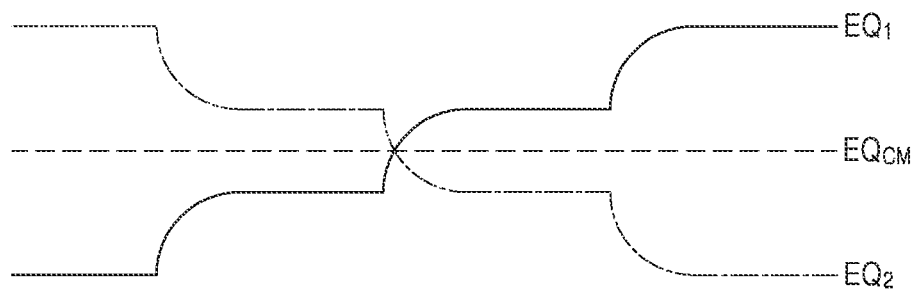
FIGS. 4A and 4B are waveform diagrams illustrating differential output signals of an ideal CTLE cell and a difference therebetween according to the related art.
Figure 4B:
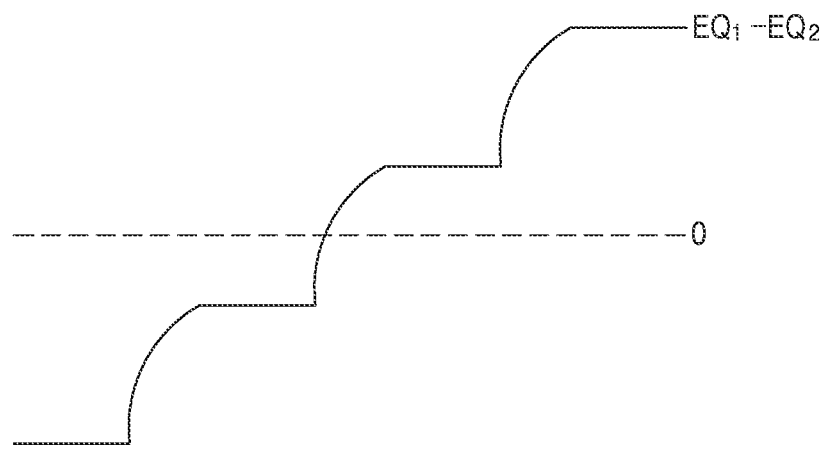
Figure 5A:
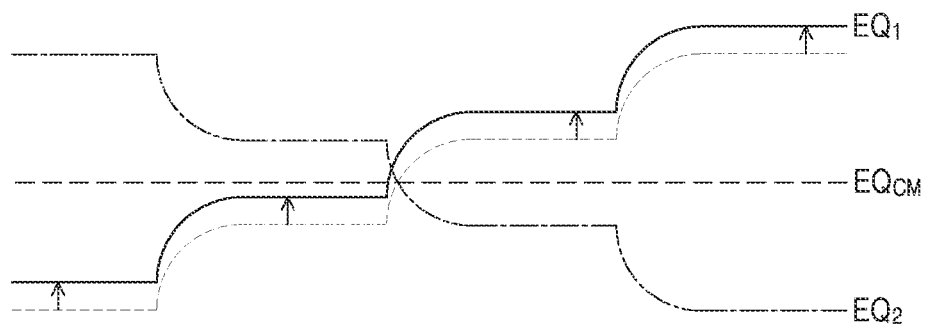
FIGS. 5A and 5B are waveform diagrams illustrating differential output signals of an ideal CTLE cell in which an offset is generated and a difference therebetween according to the related art.
Figure 5B:
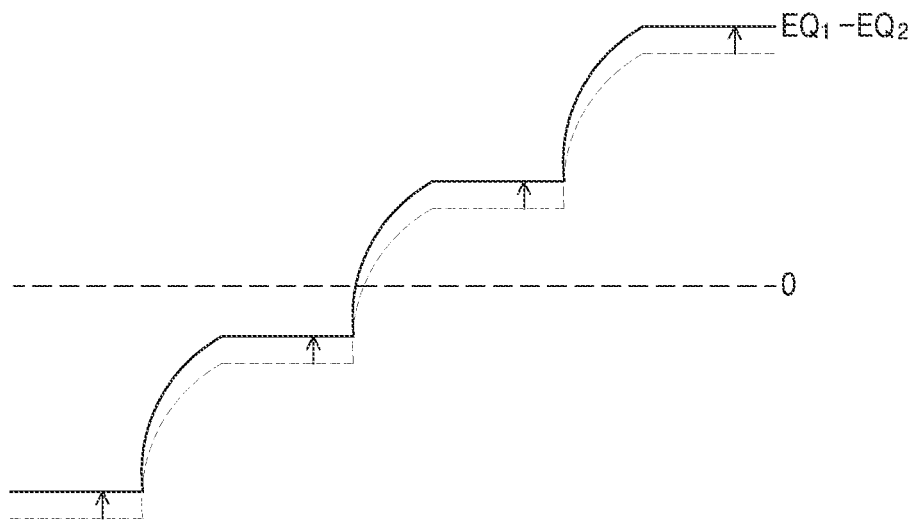

Hereinafter, the operation of the CTLE according to the disclosure will be described in detail with reference to FIGS. 6 to 8. However, the adjustment of the capacitor Cs and the resistor R$_s$ is the same as that of the CTLE cell described with reference to FIG. 3, and thus, detailed descriptions thereof will be omitted.

First, the differential input signals RX$_1$ and RX$_2$ are respectively applied through the input terminals IN$_1$ and IN$_2$ and the CTLE cell 100 equalizes the differential input signals RX$_1$ and RX$_2$ according to an initial value and outputs the differential output signals EQ$_1$ and EQ$_2$ respectively through the output terminals OUT$_1$ and OUT$_2$.

The differential output signals EQ$_1$ and EQ$_2$ output by the CTLE cell 100 are filtered by the LPF 500. The low-band differential signals EQ$_{1L}$ and EQ$_{2L}$ output by the LPF 500 are applied to the error amplifier 600.

The error amplifier 600 amplifies a difference between the low-band differential signals EQ$_{1L}$ and EQ$_{2L}$, outputs the amplified difference as the control voltage R$_{CTRL}$, and applies the control voltage R$_{CTRL}$ to the CTLE cell 100.

The third transistor $TR_3$ may be a P-MOSFET.

When the control voltage $R_{CTRL}$ is applied to the gate $G_3$, a resistance value between the source $S_3$ and the drain $D_3$ of the third transistor $TR_3$ changes. For example, it is supposed that a voltage firstly supplied by a supply voltage source is 1V. When the control voltage $R_{CTRL}$ is equal to or greater than 0.8V, because the third transistor $TR_3$ is completely turned off, a substantially open circuit is formed between the source $S_3$ and the drain $D_3$. When the control voltage $R_{CTRL}$ is equal to or smaller than 0.3V, because the third transistor $TR_3$ is completely turned on, a substantially short circuit is formed between the source $S_3$ and the drain $D_3$. When the control voltage $R_{CTRL}$ is between 0.3V and 0.8V, the resistance value between the source $S_3$ and the drain $D_3$ increases as the control voltage $R_{CTRL}$ increases.

Figure 8:
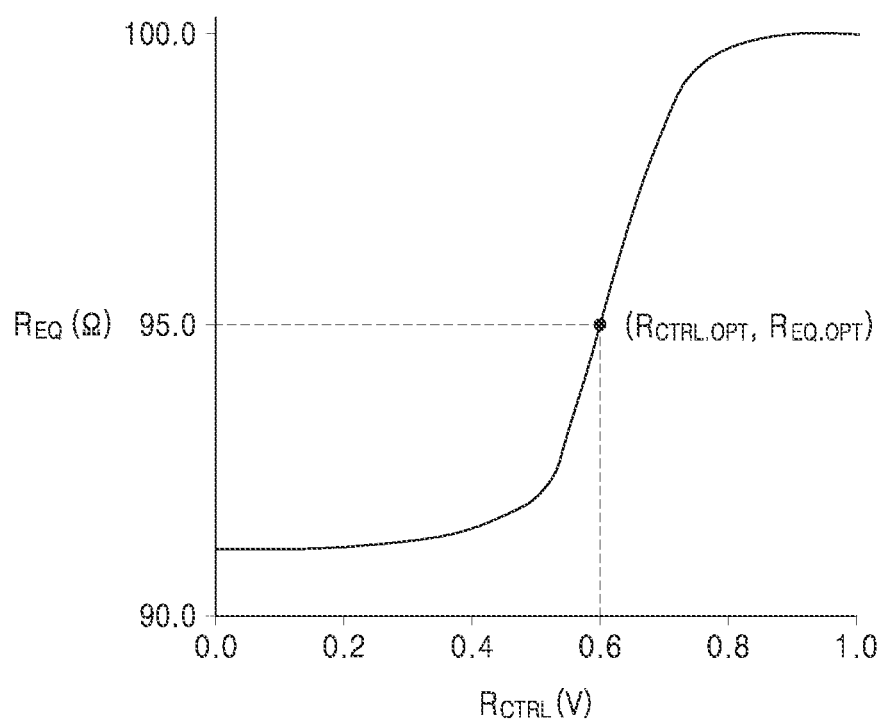
FIG. 8 is a graph illustrating a resistance value of an offset compensator according to a control voltage.

FIG. 8 is a graph illustrating a resistance value of the offset compensator OFFSET_COMP according to the control voltage $R_{CTRL}$.

Referring to FIG. 8, a resistance value $R_{EQ}$ of the offset compensator OFFSET_COMP changes according to the control voltage $R_{CTRL}$.

Specifically, the resistance value $R_{EQ}$ increases as the control voltage $R_{CTRL}$ increases and decreases as the control voltage $R_{CTRL}$ decreases.

That is, the resistance value $R_{EQ}$ of the offset compensator OFFSET_COMP is closer to the resistance value of the resistor $R_{D2}$ as the control voltage $R_{CTRL}$ increases and is closer to $R_{D2}\|R_{DS}$ as the control voltage $R_{CTRL}$ decreases.

In other words, the maximum value of the resistance value $R_{EQ}$ of the offset compensator OFFSET_COMP is $R_{D2}$, and the minimum value is $$R_{D2}\|R_{DS}(=\frac{R_{D2}R_{DS}}{R_{D2}+R_{DS}}).$$

This is expressed as Equation 4 below.

$$\frac{R_{D2}R_{DS}}{R_{D2}+R_{DS}} \le R_{EQ} \le R_{D2} \qquad \text{[Equation 4]}$$

According to Equation 4, the resistance value $R_{EQ}$ of the offset compensator OFFSET_COMP increases or decreases according to a change in the control voltage $R_{CTRL}$.

When the resistance value $R_{EQ}$ changes, the voltage applied to the offset compensator OFFSET_COMP changes, and as a result, a potential difference between the supply voltage source VDD and the output terminal $OUT_2$, that is, the potential (or voltage) of the output terminal $OUT_2$, changes.

This will be described in more detail below.

First, for convenience of explanation, it is supposed that the optimum value of the control voltage $R_{CTRL}$ is the optimum control voltage $R_{CTRL.OPT}$=0.6V, and in this regard, the resistance value $R_{EQ}$ of the offset compensator OFFSET_COMP is the optimum resistance value $R_{EQ.OPT}$=95Ω.

First, when the control voltage $R_{CTRL}$=0.7V, $R_{EQ}$>$R_{EQ.OPT}$ (see FIG. 8).

Therefore, a voltage drop by the offset compensator OFFSET_COMP is greater than a voltage drop when the optimum control voltage $R_{CTRL.OPT}$=0.6V and the potential of the output terminal $OUT_2$ is lower than a voltage drop when the optimum control voltage $R_{CTRL.OPT}$=0.6V.

Accordingly, $EQ_{1L}$>$EQ_{2L}$ is established between the low-band differential signals $EQ_{1L}$ and $EQ_{2L}$ output by the LPF 500 and the control voltage $R_{CTRL}$ output by the error amplifier 600 decreases.

Second, when the control voltage $R_{CTRL}$=0.5V, $R_{EQ}$<$R_{EQ.OPT}$ (see FIG. 8).

Therefore, the voltage drop by the offset compensator OFFSET_COMP is less than the voltage drop when the optimum control voltage $R_{CTRL.OPT}$=0.6V and the potential of the output terminal $OUT_2$ is lower than a voltage drop when the optimum control voltage $R_{CTRL.OPT}$=0.6V.

Accordingly, $EQ_{1L}$<$EQ_{2L}$ is established between the low-band differential signals $EQ_{1L}$ and $EQ_{2L}$ output by the LPF 500 and the control voltage $R_{CTRL}$ output by the error amplifier 600 increases.

The above-described process is repeated until the control voltage $R_{CTRL}$ converges to the optimum control voltage $R_{CTRL.OPT}$. That is, when the control voltage $R_{CTRL}$ is less than the optimal control voltage $R_{CTRL.OPT}$, the process of increasing the control voltage $R_{CTRL}$ occurs and when the control voltage $R_{CTRL}$ is greater than the optimal control voltage $R_{CTRL.OPT}$, the process of decreasing the control voltage $R_{CTRL}$ occurs so that the control voltage $R_{CTRL}$ converges to the optimum control voltage $R_{CTRL.OPT}$.

While the disclosure has been particularly shown and described with reference to embodiments thereof, it will be understood that various changes in form and details may be made therein without departing from the spirit and scope of the following claims.

What is claimed is:

1. A continuous-time linear equalizer (CTLE) cell constituting a CTLE that equalizes differential input signals and respectively generates differential output signals, the CTLE cell comprising:
   a first transistor comprising a first input terminal to which a first of the differential input signals is applied and a first output terminal configured to output a first of the differential output signals;
   a second transistor comprising a second input terminal to which a second of the differential input signals is applied and a second output terminal configured to output a second of the differential output signals; and
   an offset compensator configured to adjust a potential difference between a supply voltage source and the second output terminal according to an average of a control voltage corresponding to a difference between low-band differential signals obtained by respectively low-pass filtering the differential output signals.

2. The CTLE cell of claim 1, wherein the offset compensator comprises:
   a third transistor comprising a gate to which the control voltage is applied and a source electrically connected to the supply voltage source;
   a first resistor configured to electrically connect a drain of the third transistor to the second output terminal; and
   a second resistor configured to electrically connect the source of the third transistor to the second output terminal.

3. The CTLE cell of claim 2, wherein the third transistor comprises a P-MOSFET.

4. The CTLE cell of claim 2, wherein:
   the first transistor comprises a drain corresponding to the first output terminal and a gate corresponding to the first input terminal; and
   the second transistor comprises a drain corresponding to the second output terminal and a gate corresponding to the second input terminal.

5. The CTLE cell of claim 4, further comprising a third resistor configured to electrically connect the supply voltage source to the first output terminal.

6. A continuous-time linear equalizer (CTLE) that equalizes differential input signals and respectively generates differential output signals, the CTLE comprising:
a CTLE cell comprising input terminals to which the differential input signals are respectively applied and output terminals configured to respectively output the differential output signals;
a low-pass filter configured to respectively output low-band differential signals obtained by respectively low-pass filtering the differential output signals; and
an error amplifier configured to amplify a difference between the low-band differential signals and output the amplified difference as a control voltage, wherein:
the CTLE cell comprises:
a first transistor comprising a first input terminal of the input terminals and a first output terminal of the output terminals;
a second transistor comprising a second input terminal of the input terminals and a second output terminal of the output terminals; and
an offset compensator configured to adjust a potential difference between a supply voltage source and the second output terminal according to an average of the control voltage.

7. The CTLE of claim 6, wherein the offset compensator comprises:
a third transistor comprising a gate to which the control voltage is applied and a source electrically connected to the supply voltage source;
a first resistor configured to electrically connect a drain of the third transistor to the second output terminal; and
a second resistor configured to electrically connect the source of the third transistor to the second output terminal.

8. The CTLE of claim 7, wherein the third transistor comprises a P-MOSFET.

9. The CTLE of claim 7, wherein:
the first transistor comprises a drain corresponding to the first output terminal and a gate corresponding to the first input terminal, and
the second transistor comprises a drain corresponding to the second output terminal and a gate corresponding to the second input terminal.

10. The CTLE of claim 9, wherein the CTLE cell further comprises a third resistor configured to electrically connect the supply voltage source to the first output terminal.

11. The CTLE of claim 10, further comprising:
a capacitor connected between the supply voltage source and an output terminal of the error amplifier and configured to generate the average of the control voltage.

12. A continuous-time linear equalizer (CTLE) comprising:
a low-pass filter configured to apply low-pass filtering to equalized differential signals to generate low-band differential signals;
an error amplifier configured to amplify a difference between complementary signals of the low-band differential signals to generate an amplified difference; and
a CTLE cell configured to equalize differential input signals to generate the equalized differential signals, the CTLE cell comprising an offset compensator configured to vary a potential between a supply voltage and one complementary signal of the equalized differential signals based on an average value of the amplified difference.

13. The CTLE of claim 12, further comprising:
an integrator configured to integrate the amplified difference to generate a control signal comprising the average value of the amplified difference.

14. The CTLE of claim 13, wherein the offset compensator is configured to increase the potential between the supply voltage and the one complementary signal of the equalized differential signals as the control signal increases.

15. The CTLE of claim 14, wherein the offset compensator is configured to increase the potential between the supply voltage and the one complementary signal of the equalized differential signals by increasing an effective resistance between the supply voltage and the one complementary signal of the equalized differential signals.

16. The CTLE of claim 13, wherein the offset compensator is configured to decrease the potential between the supply voltage and the one complementary signal of the equalized differential signals as the control signal decreases.

17. The CTLE of claim 16, wherein the offset compensator is configured to decrease the potential between the supply voltage and the one complementary signal of the equalized differential signals by decreasing an effective resistance between the supply voltage and the one complementary signal of the equalized differential signals.

18. The CTLE of claim 13, wherein the offset compensator comprises:
a transistor having a gate that receives the average value of the amplified difference and a source electrically connected to the supply voltage;
a first resistor electrically connecting a drain of the transistor to an output terminal of the CTLE cell that conveys the one complementary signal of the equalized differential signals; and
a second resistor configured to electrically connect the source of the transistor to the output terminal.

19. The CTLE of claim 18, wherein the transistor is a P-MOSFET.

* * * * *